United States Patent
Hsu et al.

(10) Patent No.: US 8,228,683 B2
(45) Date of Patent: Jul. 24, 2012

(54) FRAMEWORK OF WIRELESS NETWORK ACCESS DEVICE

(75) Inventors: Yi-Chang Hsu, Jhonghe (TW); Ching-Feng Hsieh, Taipei (TW)

(73) Assignee: Askey Computer Corp., Taipei (TW)

( * ) Notice: Subject to any disclaimer, the term of this patent is extended or adjusted under 35 U.S.C. 154(b) by 410 days.

(21) Appl. No.: 12/494,704

(22) Filed: Jun. 30, 2009

(65) Prior Publication Data
US 2010/0167647 A1   Jul. 1, 2010

(30) Foreign Application Priority Data
Dec. 26, 2008   (TW) ................................ 97150887 A

(51) Int. Cl.
*H05K 1/11* (2006.01)
*H05K 1/14* (2006.01)

(52) U.S. Cl. .................... 361/792; 361/818; 361/784
(58) Field of Classification Search .................. 361/760, 361/792, 720, 728–730, 748, 784, 785, 818, 361/816, 807, 810; 174/117 F, 254–258; 439/470, 502, 623, 624, 638, 655, 680
See application file for complete search history.

(56) References Cited

U.S. PATENT DOCUMENTS

| 5,448,661 | A | * | 9/1995 | Takai et al. | 385/24 |
| 7,114,859 | B1 | * | 10/2006 | Tuohimaa et al. | 385/89 |
| 7,173,182 | B2 | * | 2/2007 | Katsuyama et al. | 174/36 |
| 7,244,890 | B2 | * | 7/2007 | Aisenbrey | 174/36 |
| 7,575,380 | B2 | * | 8/2009 | Wang et al. | 385/89 |
| 7,602,611 | B2 | * | 10/2009 | Peng et al. | 361/728 |
| 7,813,146 | B1 | * | 10/2010 | Phan | 361/826 |
| 2007/0125856 | A1 | * | 6/2007 | Hu | 235/451 |

* cited by examiner

*Primary Examiner* — Hung S Bui
(74) *Attorney, Agent, or Firm* — Apex Juris, pllc; Tracy M. Heims

(57) ABSTRACT

A framework of wireless network access device, comprising a communication circuit board with a first electrical connecting portion, a wireless transmission circuit board with a second electrical connecting portion, and at least a signal transmission element connecting with the first and second connecting portions respectively, wherein the signal transmission element is provided for transmitting a signal between the communication circuit board and the wireless transmission circuit board, so as to solve drawbacks of the prior art.

7 Claims, 3 Drawing Sheets

FRAMEWORK OF WIRELESS NETWORK ACCESS DEVICE

FIELD OF THE INVENTION

The present invention relates to a signal transmission technology, and more particularly, to a framework of a wireless network access device.

BACKGROUND OF THE INVENTION

Owing to the trend toward broadband network development and digital technology, communication products capable of receiving and transmitting data, such as a wireless access point (AP), cellular phone, personal digital assistant (PDA), or notebook computer, are increasingly convenient, efficient, versatile, and service-oriented.

For instance, a communication product, such as a wireless network access device, usually operates in conjunction with a communication system and a wireless transmission system. The communication system comprises a central processing unit (CPU). The wireless transmission system comprises a RF module. The communication system and the wireless transmission system are installed on the same circuit board; in other words, the circuit board is capable of communication and wireless transmission.

However, with two systems sharing a circuit board, temperature of the circuit board is high, and yet dissipation of heat generated by the circuit board is hardly efficient. Hence, to optimize a design or meet other needs, it is necessary to separate the two systems. Accordingly, the communication system and the wireless transmission system are installed on different circuit boards.

With the two separate systems, the prior art discloses maintaining integrity of data by designing a layout of a circuit board as appropriate. For example, communication takes place by means of a Peripheral Component Interconnect Express (PCIe) interface provided between the communication system and the wireless transmission system. The interface is a PCIe 2.0 or 1.1 interface, and the maximum transmission speed is 2.5 Gbps. Signal distortion, crosstalk, impedance, or electromagnetic interference (EMI) become an issue to the communication system and the wireless transmission system when the systems are not installed on the same circuit board. What the PCIe interface provides is a high-speed signal crucial to quality of communication; hence, integrity of the high-speed signal is maintained on condition that differential impedance, rise time, fall time, clock, jitter, eye diagram, etc. of the high-speed signal remain unaffected.

The PCIe interface of the wireless communication system is usually provided in the form of gold fingers, which entails designing pins and slots configured for electrical connection. As a result, the designer has to allow for the space required for inserting a card into the slots, to the detriment of reduction of height, thinning of products, and dissipation of heat generated by the system.

Alternatively, coaxial cables for transmitting data between the communication system and the wireless transmission system are fit to substitute for the PCIe interfaces essential to the aforesaid layout of a circuit board. However, as prices of precious metals and raw materials are escalating in recent years, manufacturers incur high costs whenever coaxial cables are put in a checklist of procurement. Hence, at present, manufacturers do not use coaxial cables due to low industrial applicability thereof.

As explained above, the prior art is confronted with plenty problems. Accordingly, an issue that calls for immediate solution involves proposing a signal transmission technology so as to avoid problems otherwise arising from what was taught by the prior art—separation of two systems—to eliminate previous problems with the systems installed on the same circuit board.

SUMMARY OF THE INVENTION

In view of the aforesaid drawbacks of the prior art, it is an objective of the present invention to provide a framework of a wireless network access device so as to meet design requirements.

Another objective of the present invention is to provide a framework of a wireless network access device with enhanced characteristic impedance.

To achieve the above and other objectives, the present invention provides a framework of a wireless network access device, comprising: a communication circuit board with a first electrical connecting portion; a wireless transmission circuit board with a second electrical connecting portion; and two signal transmission elements connecting with the first and second electrical connecting portions, respectively, for transmitting a signal between the communication circuit board and the wireless transmission circuit board.

In an embodiment, first and second terminals of the framework of a wireless network access device are oriented in opposite directions; and, in another embodiment, the first and second terminals are oriented in directions intersecting at an angle, wherein the angle is 90 degrees. In an embodiment, a plurality of signal lines total six; and, in another embodiment, the signal lines total eight, wherein the signal lines comprise four twisted-pair cables tightly wound in parallel. The signal transmission elements comprise a shielding layer, such as a conductive fabric.

Unlike the prior art that discloses maintaining integrity of a signal by modifying a layout of a circuit board, the present invention teaches providing signal transmission elements electrically connecting with systems installed on different circuit boards to meet design requirements on the premise that signal integrity is maintained, thereby overcoming drawbacks of the prior art regarding thinning and heat dissipation. Also, the present invention teaches providing signal lines in the form of tight-wound, parallel twisted-pair cables so as to provide enhanced characteristic impedance.

BRIEF DESCRIPTION OF THE DRAWINGS

To enable persons skilled in the art to gain insight into the other advantages and effects of the present invention readily, the present invention is hereunder illustrated with specific embodiments in conjunction with the accompanying drawings, wherein.

DETAILED DESCRIPTION OF THE EMBODIMENTS

Figure 1:
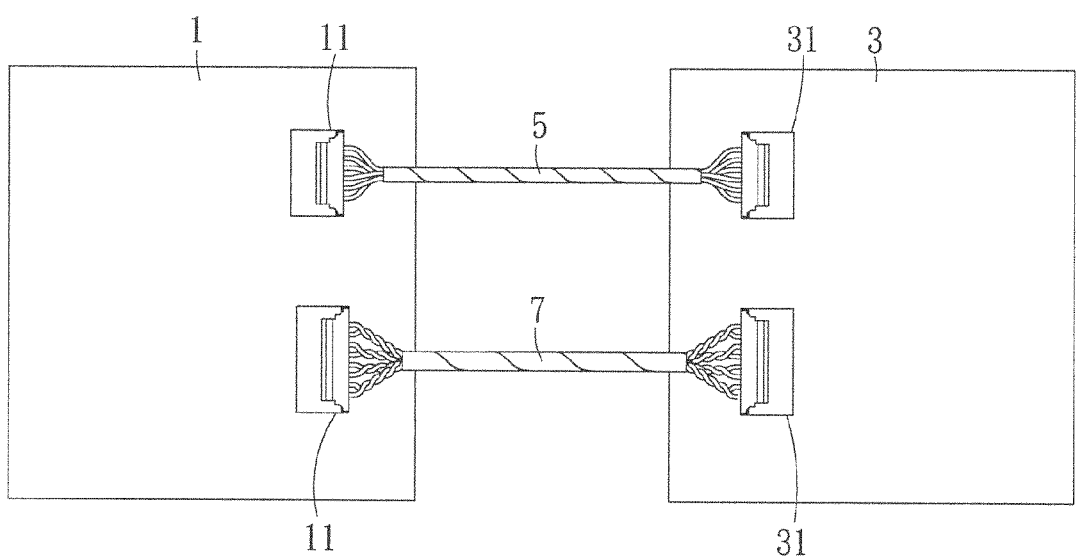
FIG. 1 is a schematic view of a first embodiment of a framework of a wireless network access device of the present invention.
Figure 2:
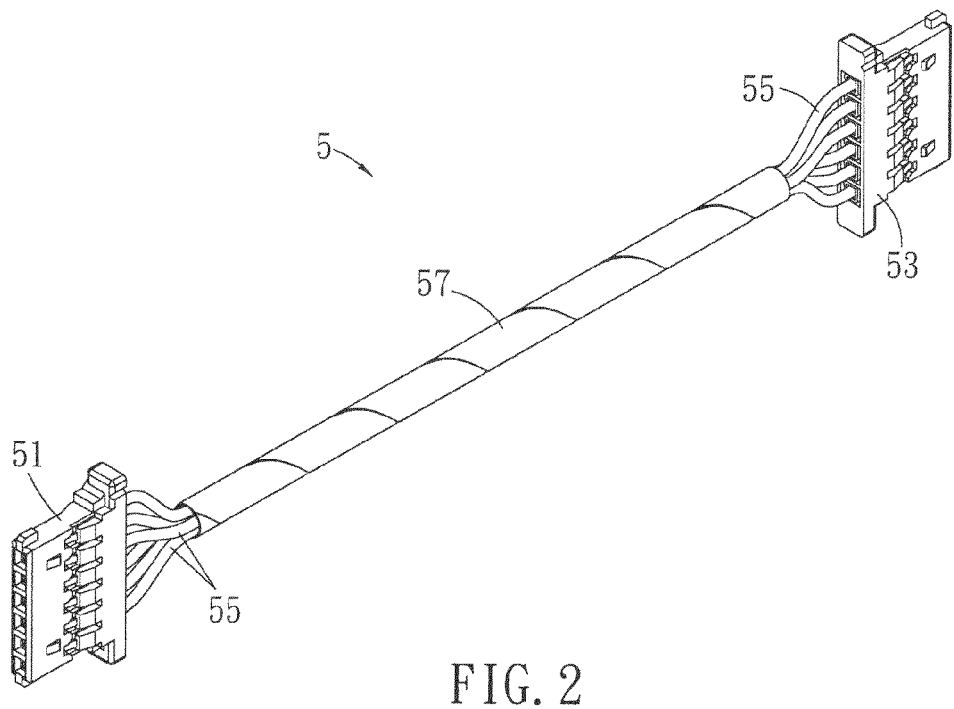
FIG. 2 is a schematic view of a signal transmission element shown in FIG. 1 according to the present invention.
Figure 3:
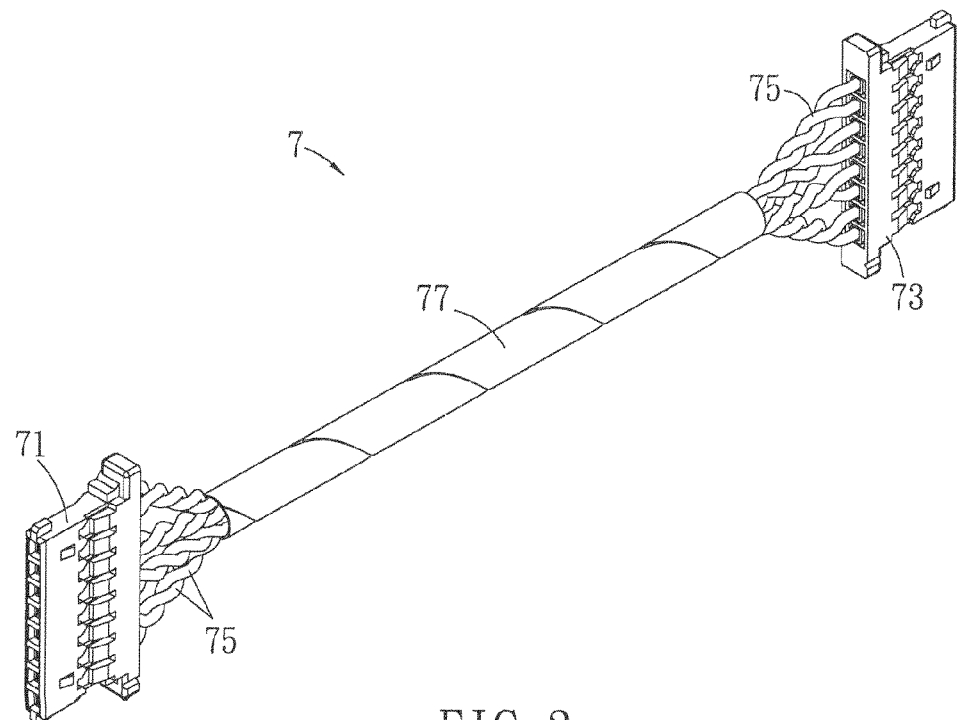
FIG. 3 is a schematic view of another signal transmission element shown in FIG. 1 according to the present invention.

Referring to FIG. 1 through FIG. 3, schematic views of a first embodiment of a framework of a wireless network access device of the present invention are shown. Referring to FIG. 1, in the first embodiment, a framework of a wireless network access device comprises: a communication circuit board 1, a wireless transmission circuit board 3, and signal transmission elements 5, 7 for transmitting a signal between the communication circuit board 1 and the wireless transmission circuit board 3.

The communication circuit board 1 has a first electrical connecting portion 11. In the first embodiment, the first electrical connecting portion 11 is a port, and the communication circuit board 1 is provided with a central processing unit (CPU) (not shown) electrically connected to the first electrical connecting portion 11.

The wireless transmission circuit board 3 has a second electrical connecting portion 31. In the first embodiment, the second electrical connecting portion 31 is a port, and the wireless transmission circuit board 3 is provided with a RF module and an antenna module (not shown) electrically connected to the second electrical connecting portion 31.

The signal transmission elements 5, 7 each assume an I-shape substantially and connect with the first electrical connecting portion 11 and the second electrical connecting portion 31. Referring to FIG. 2, the signal transmission element 5 comprises: a first terminal 51, a second terminal 53 opposing the first terminal 51, a plurality of signal lines 55 for connecting the first terminal 51 and the second terminal 53, and a shielding layer 57 for enclosing a portion of the signal lines 55. Referring to FIG. 3, the signal transmission element 7 comprises: a first terminal 71, a second terminal 73 opposing the first terminal 71, a plurality of signal lines 75 for connecting the first terminal 71 and the second terminal 73, and a shielding layer 77 for enclosing a portion of the signal lines 75.

In the first embodiment, the first terminal 51 and the second terminal 53 are oriented in opposite directions. The signal lines 55 total six. The shielding layer 57 is a conductive fabric wound around the signal lines 55 enclosed therein. The shielding layer 57 is spaced apart from the first terminal 51 and the second terminal 53. Likewise, the first terminal 71 and the second terminal 73 are oriented in opposite directions. The signal lines 75 total eight, wherein the signal lines 75 comprise four pairs of twisted-pair cables tightly wound in parallel. Hence, the first embodiment of a framework of a wireless network access device of the present invention provides enhanced characteristic impedance so as to reduce crosstalk, electromagnetic interference (EMI), and signal distortion. However, persons skilled in the art understand that the present invention is not limited the above disclosure in the first embodiment. The shielding layer 77 is a conductive fabric and is wound around the signal lines 75 enclosed therein. Likewise, the shielding layer 77 is spaced apart from the first terminal 71 and the second terminal 73. The shielding layers 57, 77 are tube-shaped so as to enclose the signal lines 55, 75, respectively. Portions of the signal lines 55, 75 are exposed from the two ends of the shielding layers 57, 77, respectively, and the exposed portions of the signal lines 55, 75 fan out.

It should be noted that each of the shielding layers 57, 77 is, for example, a conductive fabric selectively made of a material including, but not limited to, polyester, nickel, or copper. Any equivalent conductive fabric fit for electromagnetic wave shielding and thereby effective in preventing electromagnetic interference (EMI) and radio frequency interference (RFI) is applicable to the present invention.

In the first embodiment, the first terminal 51, the second terminal 53, the first terminal 71, and the second terminal 73 each assume substantially rectangular shape and have an expanding bottom, an electrical connecting portion extending from the bottom and being rectangular and relatively narrow, and a step portion extending outward from the bottom. However, in any other embodiments, it will be feasible to modify the aforesaid structure of the terminals, provided that the modified structure of the terminals enables a signal to be transmitted between the communication circuit board 1 and the wireless transmission circuit board 3.

Figure 4A:
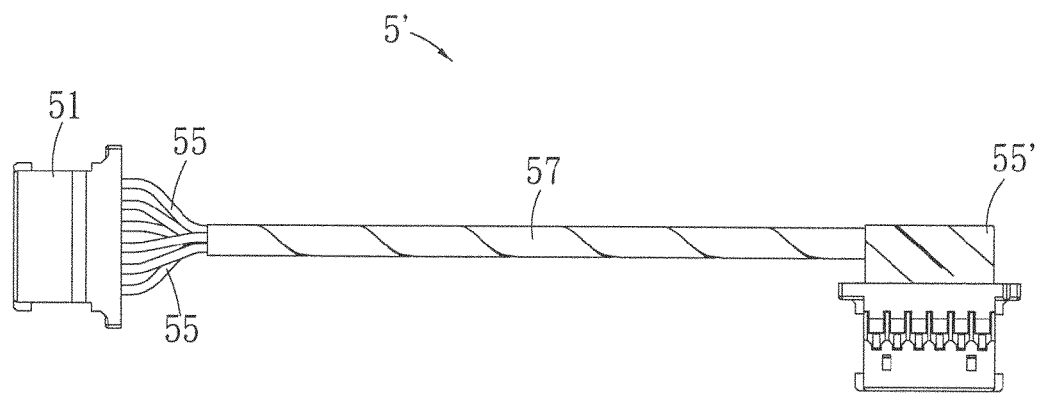
FIG. 4a and FIG. 4b are partial schematic views of a second embodiment of the present invention, showing variations in arrangement of terminals of the signal transmission elements.
Figure 4B:
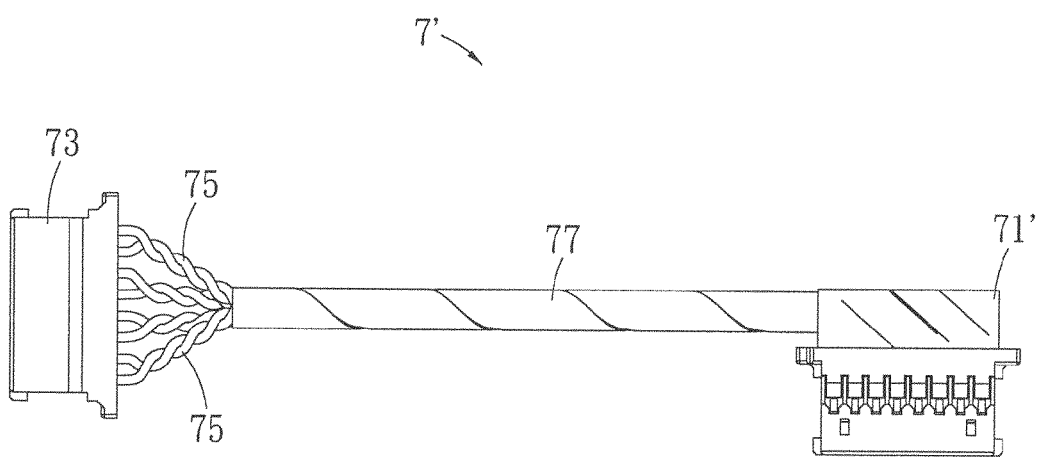

Referring to FIG. 4a and FIG. 4b, partial schematic views of a second embodiment of the present invention are shown. In the first and second embodiments, like or similar elements are denoted alike, using like or similar reference numerals. Descriptions of the first embodiment are not repeated in the second embodiment in detail.

Although, in the first embodiment, the signal transmission elements 5, 7 are substantially I-shaped, configuration of signal transmission elements 5', 7' in the second embodiment is asymmetric as shown in FIG. 4a and FIG. 4b. In the second embodiment, the first terminal 51 and a second terminal 53' are oriented in directions intersecting at an angle, so are a first terminal 71' and the second terminal 73, wherein the angle is 90 degrees. Referring to FIG. 4a, the shielding layer 57 partially encloses the signal lines 55 when proximate to the first terminal 51, but completely encloses the signal lines 55 when proximate to the second terminal 53'. Referring to FIG. 4b, the shielding layer 77 partially encloses the signal lines 75 when proximate to the second terminal 73, but completely encloses the signal lines 75 when proximate to the first terminal 71'.

As explained above, in the aforesaid embodiments, the present invention teaches providing signal transmission elements to meet design requirements on the premise that signal integrity is maintained, and selectively changing the configuration and arrangement of at least one of the terminals so as to be applicable to circuit boards that come in different specifications. In other words, although in the aforesaid embodiments the configuration and arrangement of the second terminal 53' and the first terminal 71' is selectively changed, any other embodiments can involve changing the configuration and arrangement of the other terminals selectively and changing the number of the terminals involved without being limited by the aforesaid embodiments. The aforesaid changes are comprehensible to and accomplishable by persons skilled in the art, and thus drawings and descriptions related to the aforesaid changed are omitted herein.

Compared with the prior art, the present invention teaches providing signal transmission elements electrically connecting with systems installed on different circuit boards to meet design requirements on the premise that signal integrity is maintained, thereby allowing heat generated by the circuit boards to be efficiently dissipated and the total thickness of the systems and circuit boards to be reduced; hence, the present invention is advantageous in both thinning and heat dissipation. Last but not least, the present invention teaches providing signal lines in the form of tight-wound, parallel twisted-pair cables so as to provide enhanced characteristic impedance.

The foregoing embodiments serve to illustrate principles and effects of the present invention rather than impose limitations upon the present invention. Persons skilled in the art can modify or change the embodiments without going against the spirit and scope of the present invention. Hence, all equivalent modifications or changes carried out to the embodiments by persons skilled in the art without departing from the spirit and technical notions of the present invention still are deemed ones that fall within the scope of disclosure of the present invention as defined by the claims presented hereunder.

What is claimed is:

1. A framework of a wireless network access device, comprising:
   a communication circuit board with a first electrical connecting portion;
   a wireless transmission circuit board with a second electrical connecting portion; and
   signal transmission elements, having a first terminal, a second terminal, a plurality of signal lines for connecting the first and second terminals, and a shielding layer for enclosing at least a portion of the signal lines are connecting with the first and second electrical connecting portions, respectively, for transmitting a signal between the communication circuit board and the wireless transmission circuit board, wherein the first and second terminals are oriented so that the signal lines of the first and second terminals are arranged in opposite directions.

2. The framework of the wireless network access device of claim 1, wherein the first and second terminals are oriented in directions intersecting at an angle.

3. The framework of the wireless network access device of claim 2, wherein the angle is 90 degrees.

4. The framework of the wireless network access device of claim 1, wherein the signal lines total six.

5. The framework of the wireless network access device of claim 1, wherein the signal lines total eight.

6. The framework of the wireless network access device of claim 5, wherein the signal lines comprise four pairs of twisted-pair cables tightly wound in parallel.

7. The framework of the wireless network access device of claim 1, wherein the shielding layer is a conductive fabric.

* * * * *